(12) United States Patent
Maehira et al.

(10) Patent No.: US 10,720,858 B2
(45) Date of Patent: Jul. 21, 2020

(54) ATTRACTION DEVICE, METHOD FOR PRODUCING ATTRACTION DEVICE, AND VACUUM PROCESSING DEVICE

(71) Applicant: ULVAC, INC., Chigasaki-shi (JP)

(72) Inventors: Ken Maehira, Chigasaki (JP); Kou Fuwa, Chigasaki (JP)

(73) Assignee: ULVAC, INC., Chigasaki-shi (JP)

( * ) Notice: Subject to any disclaimer, the term of this patent is extended or adjusted under 35 U.S.C. 154(b) by 56 days.

(21) Appl. No.: 15/719,947

(22) Filed: Sep. 29, 2017

(65) Prior Publication Data

US 2018/0175749 A1    Jun. 21, 2018

Related U.S. Application Data

(63) Continuation of application No. PCT/JP2016/060909, filed on Apr. 1, 2016.

(30) Foreign Application Priority Data

Apr. 2, 2015   (JP) .................................. 2015-075938

(51) Int. Cl.
*H02N 13/00*   (2006.01)
*H01L 21/683*   (2006.01)
(Continued)

(52) U.S. Cl.
CPC ............... *H02N 13/00* (2013.01); *B23Q 3/15* (2013.01); *H01J 37/32715* (2013.01);
(Continued)

(58) Field of Classification Search
CPC ................. H02N 13/00; H01L 21/6831–6833
See application file for complete search history.

(56) References Cited

U.S. PATENT DOCUMENTS

2007/0217117 A1* 9/2007 Ohta ................... H01L 21/6833
361/234

FOREIGN PATENT DOCUMENTS

JP        3324268 B2    9/2002
JP    2006-287210 A   10/2006
(Continued)

OTHER PUBLICATIONS

International Preliminary Report on Patentability for International Application No. PCT/JP2016/060909 dated Oct. 12, 2017 (8 Sheets).

(Continued)

*Primary Examiner* — Rodney G McDonald
*Assistant Examiner* — Ho-Sung Chung
(74) *Attorney, Agent, or Firm* — Kratz, Quintos & Hanson, LLP (57) ABSTRACT

Providing a technique for suppressing dust generation at the time of attraction and detachment of an object to be attracted, and for enabling control the attraction force of the attraction device to be uniform. The attraction device of the present invention includes a main body part having attraction electrodes within a dielectric; and an attraction part for attracting a substrate, provided on a surface of the main body part at an attraction-side. The attraction part includes a contact support part that is in contact with, and supports the substrate and a non-contact part that is not in contact with the substrate. In the attraction part, the volume resistivity of the material of the contact support part is greater than the volume resistivity of the material of the non-contact part.

3 Claims, 5 Drawing Sheets

(51) Int. Cl.
*H01L 21/67* (2006.01)
*B23Q 3/15* (2006.01)
*H01J 37/32* (2006.01)
*H01J 37/34* (2006.01)

(52) U.S. Cl.
CPC ........ *H01J 37/34* (2013.01); *H01L 21/67253* (2013.01); *H01L 21/683* (2013.01); *H01L 21/6833* (2013.01)

(56) References Cited

FOREIGN PATENT DOCUMENTS

| JP | 4166379 B2 | 10/2008 |
| JP | 4342691 B2 | 10/2009 |
| JP | 2009-302347 A | 12/2009 |

OTHER PUBLICATIONS

International Search Report for International Application No. PCT/JP2016/060909 dated Jun. 28, 2016.

\* cited by examiner

ATTRACTION DEVICE, METHOD FOR PRODUCING ATTRACTION DEVICE, AND VACUUM PROCESSING DEVICE

TECHNICAL FIELD

The present invention generally relates to an attraction device that attracts and holds a substrate in vacuum ambience, and in particular, to a technique for an attraction device that attracts and holds a substrate having an insulating film on the rear surface thereof and an insulating substrate.

BACKGROUND

Conventionally, an electrostatic attraction device has been widely used to precisely control the temperature of a substrate in, e.g., a sputtering device. In a device that performs processing, e.g., film forming on an insulating substrate, such as glass, in vacuum ambience, an attraction device that attracts and holds the insulating substrate by a gradient force is widely used. Furthermore, when electrostatic attracting a substrate having an insulating film on the rear surface thereof, for example, a method of increasing the attraction voltage in order to enhance the attraction force is adopted.

In such an attraction device, the entire surface is in contact with the rear surface of the substrate on the attraction surface regardless of the attraction electrode pattern. Furthermore, the positional relationship between the attraction electrode pattern and the contact part of the rear surface of the substrate has not been addressed.

Accordingly, the resistance value or distance differs between the attraction electrode and the substrate, and the attraction condition has not been uniform.

Furthermore, in an area where an attraction electrode exists directly below the contact part between the substrate and the attraction surface, the attraction force is relatively large, and the material of the rear surface of the substrate or the surface of the attraction device peels off. The foregoing is a cause of process failure due to dust generation.

As well, the attraction force due to a residual electric charge on the attraction surface becomes uneven, the substrate vibrates during transportation thereof and breakage of the substrate may be occurred.

Moreover, the non-uniformity of the residual attraction force on the attraction surface affects the attraction condition while the process is repeated. In particular, temperature control per a substrate is inconsistent. and even when the residual attraction force is removed from the attraction surface by, for example, reverse polarity voltage application, it is difficult to completely remove the residual attraction force. Accordingly, a decrease in the reliability, such as, in the yield of the production process, has been a problem.

In order to solve such a problem, the conventional in-plane attraction force is relatively reduced so as to reduce the residual attraction force, for example, the attraction area relative to the substrate is simply reduced or the applied voltage is reduced.

However, the problem of this type of method has a problem that the attraction device cannot fully demonstrate the original attraction ability due to a decrease in the efficiency of heat transfer from the attraction surface to the substrate.

On the other hand, it is desired to suppress the dust generation due to the peel-off of the material of the rear surface of the substrate or the attraction device surface as discussed above.

Another problem is that a substrate conveyance error or a decrease in the yield of each substrate can be caused by a residual attraction force, occurred by a shortened throughput time in the production process, for example. Thus, it is also desired to perform control in a manner such that the attraction force of the attraction device is uniform.

CITATION LIST

Patent Literature 1: Japanese Patent No. 4166379
Patent Literature 2: Japanese Patent No. 3324268
Patent Literature 3: Japanese Patent No. 4342691

SUMMARY OF THE INVENTION

The present invention has been made to solve the aforementioned problems associated with the conventional art. An object of the present invention is to provide a technique for suppressing dust generation at the time of attraction and detachment of an object to be attracted, and for enabling control of the attraction force of the attraction device to be uniform.

To solve the aforementioned problems, one aspect of the present invention is An attraction device comprising a main body part having an attraction electrode inside a dielectric, and an attraction part provided on a surface of the main body part at an attraction-side, the attraction part attracting an object to be attracted. The attraction part includes a contact support part that is in contact with and supports the object to be attracted and a non-contact part that is not in contact with the object to be attracted, the contact support part of the attraction part is provided in an area other than an area corresponding to the attraction electrode on the attraction-side surface of the main body part, and in the attraction part, a volume resistivity of a material of the contact support part is greater than a volume resistivity of a material of the non-contact part.

The present invention is the attraction device further includes the main body part including a base which is formed in a plate shape, and the attraction electrode is provided on a surface layer portion of one of main surfaces of the base, and a layer-shaped high resistance body that is integrally provided on the main surface on the base at an attraction electrode side, and formed of the material of the non-contact part. The contact support part of the attraction part is provided on the surface of the layer-shaped high resistance body.

The present invention is a method of manufacturing an attraction device, manufacturing the attraction device including a main body part having an attraction electrode inside a dielectric, and an attraction part provided on a surface of the main body part at an attraction-side, the attraction part attracting an object to be objected, the attraction part including a contact support part that is in contact with and supports the object to be attracted, and a non-contact part that is not in contact with the object to be attracted, and a volume resistivity of a material of the contact support part being greater than a volume resistivity of a material of the non-contact part in the attraction part. The manufacturing method includes the steps of preparing a base formed in a plate shape in which the attraction electrode is provided on a surface layer portion of one of main surfaces of the base, and a layer-shaped high resistance body formed of the material of the non-contact part, a main body part forming step for forming the main body part having the layer-shaped high resistance body integrally provided on the main surface on the attraction electrode side of the base by disposing the layer-shaped high resistance body on the main surface on an attraction electrode side of the base, and sintering the base and the layer-shaped high resistance body, and a step of providing the contact support part of the attraction part on a surface of the layer-shaped high resistance body of the main body part.

The present invention is a vacuum processing device including a vacuum chamber, and an attraction device provided in the vacuum chamber, the attraction device including a main body part having an attraction electrode inside a dielectric, and an attraction part provided on a surface of the main body part at an attraction-side, the attraction part attracting an object to be attracted, the attraction part including a contact support part that is in contact with and supports the object to be attracted, and a non-contact part that is not in contact with the object to be attracted, the contact support part of the attraction part is provided in an area other than an area corresponding to the attraction electrode on the attraction-side surface of the main body part, and in the attraction part, a volume resistivity of a material of the contact support part is greater than a volume resistivity of a material of the non-contact part. The vacuum processing device subject an object to be attracted to attract and hold by the attraction device so as to perform predetermined processing.

In the attraction device of the present invention, an attraction part provided on the surface of the main body part at the attraction-side includes a contact support part that is in contact with and supports an object to be attracted, and a non-contact part that is not in contact with the object to be attracted, the volume resistivity of the material of the contact support part is greater than the volume resistivity of the material of the non-contact part in the attraction part. The attraction force of the contact support part can thus be set to be equal to or smaller than the attraction force of the non-contact part. It is thereby possible to suppress occurrence of peel-off of the object to be attracted and the attraction device surface due to, e.g., friction at the contact portion between the attraction part and the object to be attracted. Consequently, dust generation can be prevented, and the lifespan of the attraction device can be prolonged.

Furthermore, according to the present invention, control can be performed that the attraction force of the attraction device is uniform, so that a conveyance error of the object to be attracted can thus be prevented, and a decrease in the yield can be avoided.

In the present invention, when the contact support part of the attraction part is provided so as to eliminate to overlap with the attraction electrode in an area other than the area corresponding to the attraction electrode on the surface of the main body part at the attraction-side, the distance from the attraction electrode to the surface (top portion) of the contact support part of the attraction part can be set larger than the distance from the attraction electrode to the surface of the non-contact part of the attraction part. The resistance value between the attraction electrode and the contact support part can be therefore set to a large value, whereby the Johnsen-Rahbek force can be controlled to a desired value.

Consequently, according to the present invention, and the attraction force of the contact support part and non-contact part of the attraction part can be readily adjusted, and thus, it is possible to provide an attraction device that is more versatile.

In the present invention, when the main body part includes a base which is formed into a plate shape, and the attraction electrode is provided on the surface layer portion of one of the main surfaces of the base, a layer-shaped high resistance body made of the material of the non-contact part which is integrally provided on the main surface on the attraction electrode side of the base, and the contact support part of the attraction part is provided on the surface of this layer-shaped high resistance body, it is possible to use various types of ceramic materials as a material of the base. Furthermore, the resistivity can be controlled by selecting an additive to be added to the ceramic material, and a base having a high level of rigidity, wear resistance, and thermal impact resistance can be produced by integrally sintering these materials, so that the attraction device having more versatile can be provided.

In this case, by disposing the aforementioned layer-shaped high resistance body on the main surface of the base at the attraction electrode side, and sintering the base and the layer-shaped high resistance body to form the main body part where the layer-shaped high resistance body is integrally formed, on the main surface on the attraction electrode side of the base, the aforementioned attraction device can be readily manufactured.

Furthermore, according to the vacuum processing device including a vacuum chamber, and any one of the aforementioned attraction devices provided in the vacuum chamber, the vacuum processing device is configured to subject the object to be attracted to attract and held by the attraction device so as to perform a predetermined processing, there can be provided a vacuum processing device that can perform vacuum processing of high-level.

BRIEF DESCRIPTION OF DRAWINGS

FIG. 3(a) and FIG. 3(b) schematically illustrate a configuration example of the attraction device according to the present invention, where

DETAILED DESCRIPTION OF EMBODIMENTS

Embodiments of the present invention will be described hereinbelow with reference to the drawings.

The present invention is applicable to an attraction device of a bipolar or unipolar type.

Figure 1:
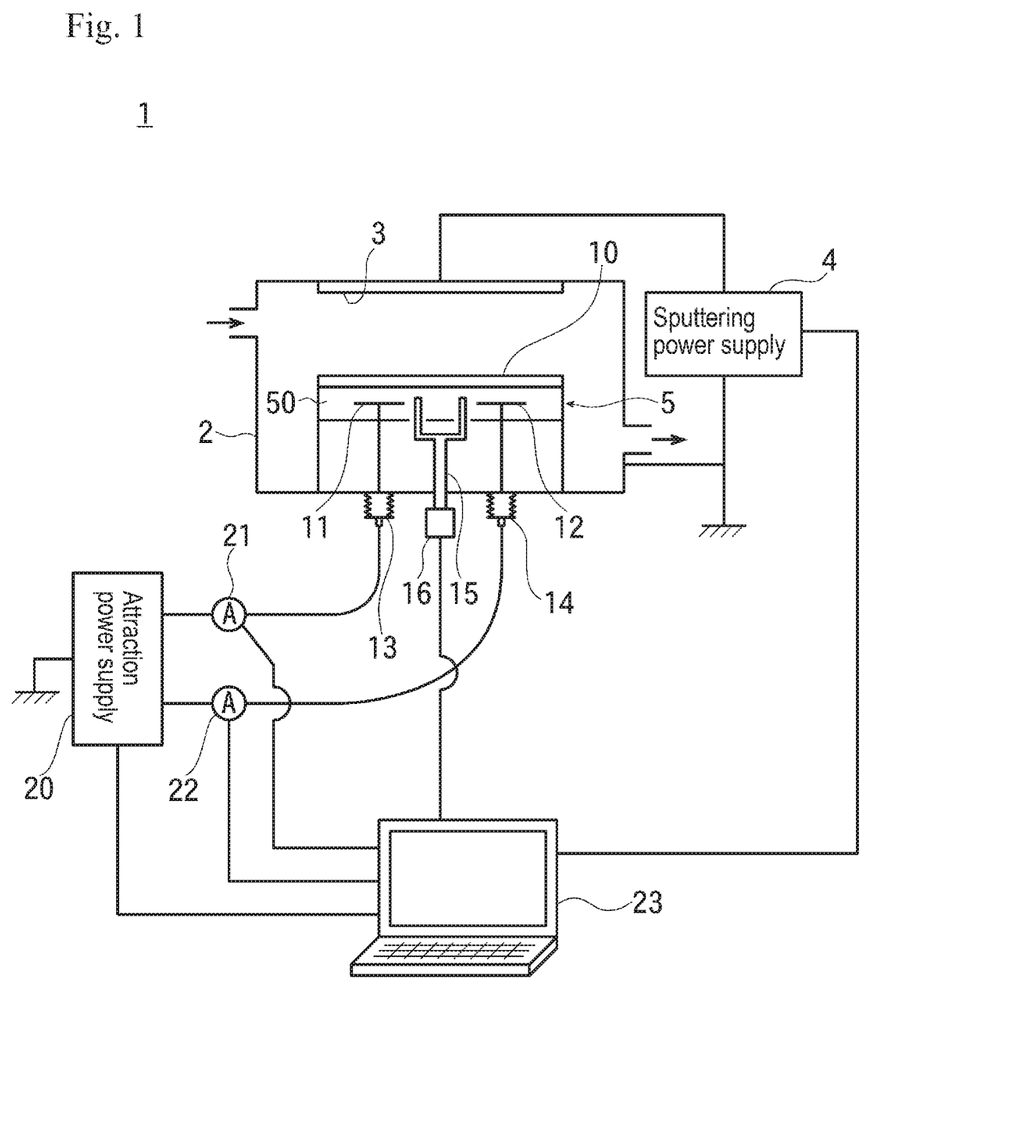
FIG. 1 is a schematic diagram illustrating a configuration of a sputtering device that is one embodiment of a vacuum processing device according to the present invention.

FIG. 1 is a schematic diagram illustrating a configuration of a sputtering device that is one embodiment of a vacuum processing device according to the present invention.

In FIG. 1, reference numeral 2 denotes a vacuum chamber of a sputtering device 1 according to this embodiment. This vacuum chamber 2 is connected to a vacuum evacuation system (not shown in the drawings), and is configured such that a sputtering gas is introduced into the vacuum chamber 2.

A target 3, which is a source of film formation, is disposed at the upper portion of the vacuum chamber 2.

This target 3 is connected to a sputtering power supply 4, and a negative bias voltage is applied to the target 3. The positive side of the sputtering power supply 4 is earthed together with the vacuum chamber 2.

Inside the vacuum chamber 2, an attraction device 5 for attracting and holding a substrate (object to be attracted) 10 is provided. This attraction device 5 is of a bipolar type. Within a main body part 50 formed of a dielectric, a pair of attraction electrodes 11 and 12 is disposed. The attraction device 5 is configured such that power is supplied to these attraction electrodes 11 and 12 via current introduction terminals 13 and 14, respectively, from an attraction power supply 20 provided outside the vacuum chamber 2.

Ammeters 21 and 22 that can perform micro current measurement are connected between each of the current introduction terminals 13 and 14 and the attraction power supply 20.

On the other hand, at the bottom portion of the vacuum chamber 2, an elevation mechanism 15 for placing the substrate 10 on the attraction device 5 or detaching the substrate 10 from the attraction device 5 is provided.

Furthermore, a computer 23 for controlling the entire device is provided outside the vacuum chamber 2. This computer 23 is connected to a driving part 16 that drives the aforementioned elevation mechanism 15, the ammeters 21 and 22, the attraction power supply 20, and the sputtering power supply 4.

This computer 23 includes an A/D conversion board and is connected to a means (not shown in the drawings) such as a means for recording the current, for example, a pen recorder.

Figure 2:
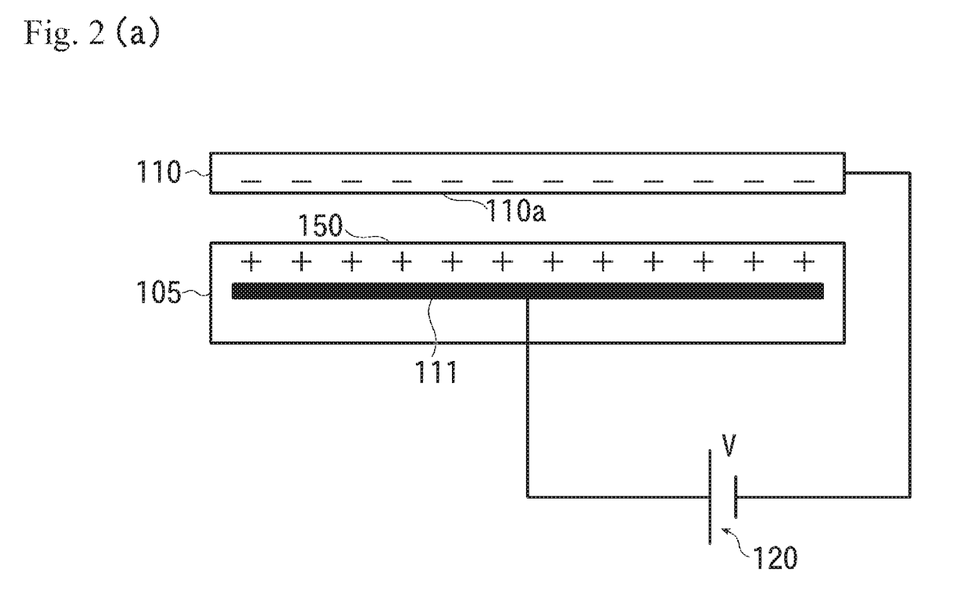
FIG. 2(a) is a schematic diagram illustrating a configuration of a cross sectional view of an attraction device of an entire surface attraction type.
FIG. 2(b) is an equivalent circuit diagram illustrating the principle of substrate attraction.

The principle of the present invention will be described. FIG. 2(a) is a schematic diagram illustrating a configuration of a cross section of an attraction device of an entire surface attraction type.

As illustrated in FIG. 2(a), a predetermined voltage from an attraction power supply 120 is applied between an attraction electrode 111 which is provided inside an attraction device 105 formed of a dielectric and the substrate 110, and thereby, reverse polarity charges are generated on an attraction surface 150 of the attraction device 105 and a rear surface 110a of the substrate 110. Consequently, the attraction surface 150 of the attraction device 105 and the substrate 110 are restricted by Coulomb's force, so that the substrate 110 is held on the attraction surface 150.

FIG. 2(b) shows an equivalent circuit diagram illustrating the principle of substrate attraction.

First, Coulomb's force Fc will be considered in order to calculate the attraction force F. In this case, the following equation holds true where ε denotes the dielectric constant of the dielectric layer of the attraction device 105, V denotes the applied voltage, d denotes the distance of the dielectric layer, and S denotes the area of the charged portion of the substrate 110 and the attraction device 105:

$$Fc = 1/2 \cdot \varepsilon \cdot S (V/d)^2.$$

For the actual attraction device, Coulomb's force Fc, in which the capacitance of the dialectic is employed, and Johnsen-Rahbek force Fjr, which is generated by occurrence of a micro current in a very small area between the substrate and the attraction electrode, are summed. Consequently, the attraction force F acting between the attraction device and the substrate is given by the following equation:

$$F = Fc + Fjr.$$

It is generally known that the Johnsen-Rahbek force is relatively greater than Coulomb's force.

Furthermore, Coulomb's force and the Johnsen-Rahbek force depend on the volume resistivity of the dielectric. In the low resistivity range ($1 \times 10^{12}$ Ω·cm or lower), the Johnsen-Rahbek force is known to be dominant. In the high resistivity range ($1 \times 10^{13}$ Ω·cm or greater), Coulomb's force is known to be dominant.

Accordingly, it is understood that difference of the attraction force between the substrate and the attraction device occurs due to the volume resistivity of the dielectric.

The present invention has been made on the basis of the foregoing knowledge.

Figure 3A:
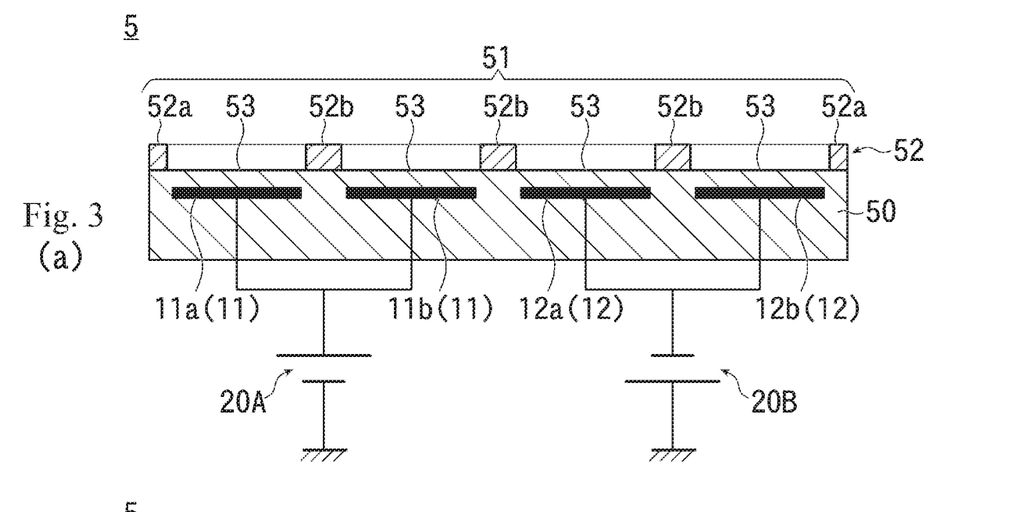
FIG. 3(a) is a cross-sectional view of the configuration, and FIG. 3 (b) is a plan view of the configuration.
Figure 3B:
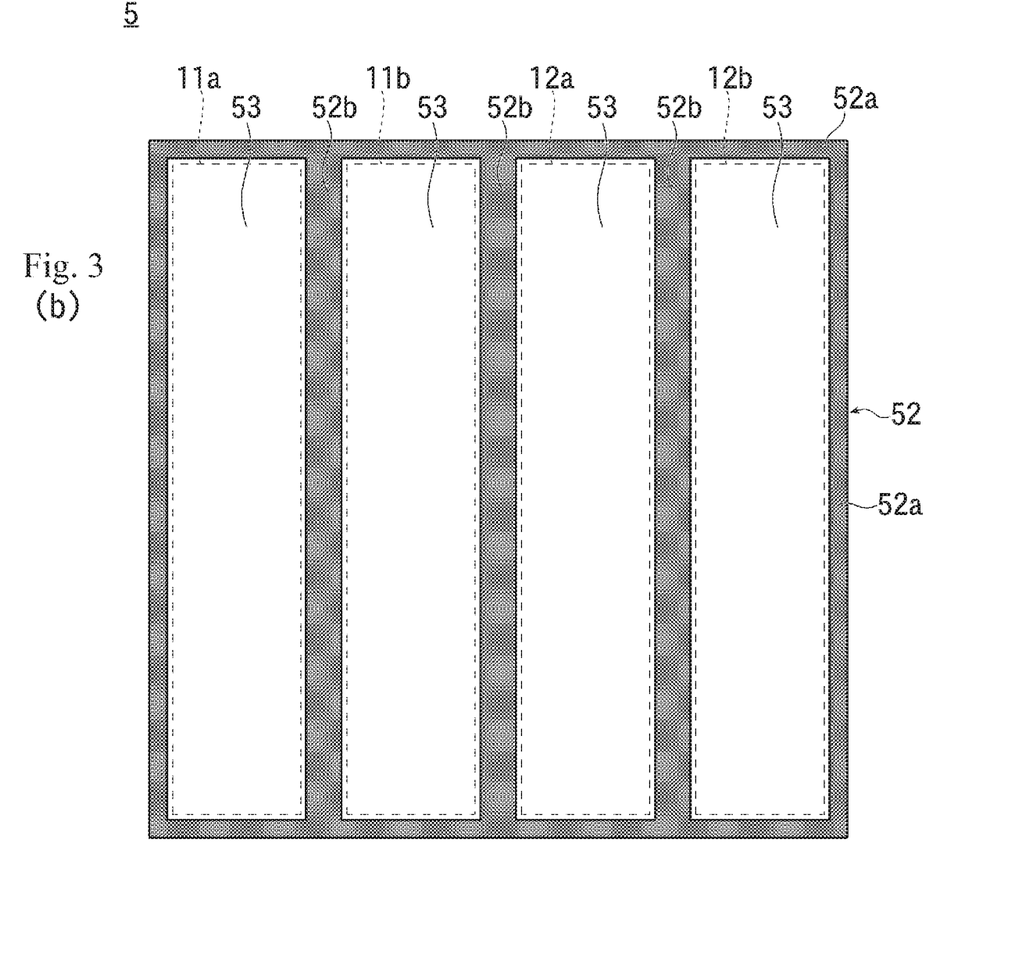

FIG. 3(a) and FIG. 3(b) schematically shows a configuration example of the attraction device according to the present invention, where FIG. 3(a) is a cross-sectional view of the configuration, and FIG. 3 (b) is a plan view of the configuration.

As shown in FIG. 3 (a), the attraction device 5 of this configuration example is of a bipolar type. In the inside of the main body part 50 formed of a dielectric in, for example, having a rectangular plate shape and is described later, first attraction electrodes 11a and 11b, and second attraction electrodes 12a and 12b are provided as the aforementioned attraction electrodes 11 and 12, respectively.

In this embodiment, the first attraction electrodes 11a and 11b and the second attraction electrodes 12a and 12b are connected, respectively, to the attraction power supplies 20A and 20B, whose polarities differ from each other.

As shown in FIG. 3(b), according to this configuration example, the first attraction electrodes 11a and 11b and the second attraction electrodes 12a and 12b are each formed in a rectangular shape and arranged at a predetermined interval.

The arrangement of the first attraction electrodes 11a and 11b and the second attraction electrodes 12a and 12b is schematically illustrated. In general, electrodes having different polarities are alternately arranged.

On the other hand, on the surface of the main body part 50 at the attraction-side, an attraction part 51 that attracts the substrate 10 is provided.

The attraction part 51 of this configuration example includes a contact support part 52 that is in contact with the rear surface of the substrate 10 and supports the substrate 10, and a non-contact part 53 that is not in contact with the rear surface of the substrate 10.

The contact support part 52 includes: a frame part 52a that is formed on the edge of the main body part 50 in a rectangular frame-shape, for example, whose outer diameter is equal to that of the main body part 50; and a straight part 52b that is formed integrally and straight-shape inside the frame part 52a.

Here, the frame part 52a is formed to protrude so that the height thereof is constant and higher than that of the non-contact part 53 to be described later.

Furthermore, a plurality of the straight parts 52b are provided and arranged at a predetermined interval, for example, in parallel with each other.

The straight part 52b is disposed in a manner such that the height thereof is constant and equal to height of the frame part 52a.

On the other hand, the non-contacts part 53 of this configuration example are formed as a plane-shape by exposing the surface of the main body part 50 between the frame part 52a and the straight part 52b of the contact support part 52. The non-contact parts 53 are formed to have an equal height.

From the viewpoint of controlling the magnitude of Johnsen-Rahbek force to a desired value by increasing the resistance value of the contact support part 52, it is preferable that the contact support part 52 be disposed in an area other than the areas corresponding to the attraction electrodes 11 and 12 on the surface of the main body part 50 the attraction-side, i.e., the area other than the areas directly above the attraction electrodes 11 and 12. However, the present invention is not particularly limited to this configuration.

In this configuration example, the frame part 52a of the contact support part 52 is provided at the peripheries of the areas directly above the attraction electrodes 11 and 12 on the surface of the main body part 50 at the attraction side.

Furthermore, the straight part 52b of the contact support part 52 is provided between the areas directly above the attraction electrodes 11 and 12 that are adjacent to each other on the surface of the main body part 50 at the attraction-side.

As shown in FIG. 3(a) and FIG. 3(b), the frame part 52a and the straight part 52b of the contact support part 52 of this configuration example are provided in an area other than the areas directly above the attraction electrodes 11 and 12 on the surface of the main body part 50 at the attraction-side. As long as the advantageous effects of the present invention can be ensured, the frame part 52a and the straight part 52b of the contact support part 52 may be configured so as to be partially overlapped in the areas directly above the attraction electrodes 11 and 12 on the attraction-side surface of the main body part 50.

In the present invention, the attraction part 51 is configured such that the volume resistivity of the material of the contact support part 52 is greater than the volume resistivity of the material of the non-contact part 53.

In this configuration example, the non-contact part 53 of the attraction part 51 is formed of the same material as the material of the main body part 50 of the attraction device 5. However, as described below, the non-contact part 53 may be formed of a different material from the material of the main body part 50 of the attraction device 5.

In the present invention, it is preferable to use a material, the volume resistivity of which has been lowered by doping an additive, as a material of the non-contact part 53 of the attraction part 51 from the viewpoint of enhancing the efficiency of heat transfer from and to the substrate 10.

Examples of such a material may include aluminum oxide doped with C, Ti, Cr, Fe, Ta, TiN, and $TiO_2$ ($Al_2O_3$, the volume resistivity: $1 \times 10^7$ to $1 \times 10^{12}$ Ω·cm), pyrolytic boron nitride doped with a CxHy-based material (PBN, the volume resistivity: $1 \times 10^8$ to $1 \times 10^{12}$ Ω·cm), silicon nitride doped with Ga, In, Al, TiN, and $TiO_2$ (SiN, the volume resistivity: $1 \times 10^8$ to $1 \times 10^{12}$ Ω·cm), aluminum nitride doped with Ti, TiN, $TiO_2$, and Ta (AlN, the volume resistivity: $1 \times 10^2$ to $1 \times 10^{15}$ Ω·cm), silicon dioxide doped with Ta, Ti, TiN, and $TiO_2$ ($SiO_2$, the volume resistivity: $1 \times 10^5$ to $1 \times 10^8$ Ω·cm), and sialon doped with Ta, Ti, TiN, and $TiO_2$ (SiAlON, the volume resistivity: $1 \times 10^{14}$ Ω·cm or lower).

On the other hand, it is preferable to use, as a material of the contact support part 52 of the attraction part 51, a material whose type is the same as the material of the non-contact part 53 and in which an additive is not doped.

Examples of such a material described as corresponding to the above-described material of the non-contact part 53 may include aluminum oxide ($Al_2O_3$, the volume resistivity: $1 \times 10^{14}$ to $1 \times 10^{15}$ Ω·cm), pyrolytic boron nitride (PBN, the volume resistivity: $1 \times 10^{14}$ to $1 \times 10^{15}$ Ω·cm), silicon nitride (SiN, the volume resistivity: $1 \times 10^{14}$ to $1 \times 10^{15}$ Ω·cm), aluminum nitride (AlN, the volume resistivity: greater than $1 \times 10^{15}$ Ω·cm), silicon monoxide (SiO, the volume resistivity: greater than $1 \times 10^{19}$ Ω·cm), and sialon (SiAlON, the volume resistivity: greater than $1 \times 10^{14}$ Ω·cm).

The main body part 50 of the attraction device 5 of the present invention can be produced by an ordinary ceramics manufacturing process (compression, sintering, and the like.).

Furthermore, the contact support part 52 to be formed on the main body part 50 can be produced by forming a predetermined pattern by a film forming process, such as PVD, CVD, or vapor deposition.

As a material of the contact support part 52 of the attraction part 51, the materials described below can be used in addition to the aforementioned materials.

Examples of the nitride used may include tantalum nitride (TaN), tungsten nitride (WN), gallium nitride (GaN), boron nitride (BN), and indium nitride (InN) and the like.

Examples of the oxide used may include silicon dioxide ($SiO_2$), chromium oxide ($Cr_2O_3$), titanium oxide ($TiO_2$), titanium monoxide (TiO), zinc oxide (ZnO), and yttrium oxide ($Y_2O_3$) and the like.

Examples of the carbide used may include diamond, polyuria (PU), titanium carbide (TiC), tantalum carbide (TaC), and silicon carbide (SiC) and the like.

Examples of the high-molecular weight polymer used may include polyimide (PI), polyurea (PU), and a silicone rubber.

Of these materials, an oxide and a carbide can be used to form the contact support part 52 of the attraction part 51 by the aforementioned film forming process.

On the other hand, polyurea (PU) and polyimide (PI), which are high-molecular weight polymers, can be used to form the contact support part 52 of the attraction part 51 by a publicly known vapor deposition polymerization method.

Furthermore, a silicone rubber can be used to form the contact support part 52 of the attraction part 51 by pasting a molded sheet.

As described above, in the attraction device 5 according to this configuration example, the attraction part 51 provided on the surface of the main body part 50 at the attraction-side includes the contact support part 52 that is in contact with and supports the substrate 10; and the non-contact part 53 that is not in contact with the substrate 10, the attraction part 51 is configured in a manner such that the volume resistivity of the material of the contact support part 52 is greater than the volume resistivity of the material of the non-contact part 53 in the attraction part 51. Thus, the attraction force of the contact support part 52 can be set smaller than the attraction force of the non-contact part 53. It is thereby possible to suppress occurrence of peel-off of the substrate 10 and the surface of the attraction device 5 at the contact portion between the attraction part 51 and the substrate 10 due to, for example, friction. Consequently, dust generation can be prevented, and also, the attraction device 5 whose lifespan is longer than the lifespan of the conventional art can be provided.

Furthermore, according to this configuration example, control can be performed such that the attraction force of the attraction device 5 is uniform, and thus, a conveyance error of the substrate 10 can be prevented, and a decrease in the yield can be avoided.

In particular, in this configuration example, the contact support part 52 of the attraction part 51 is provided in an area other than the areas corresponding to the attraction electrodes 11 and 12 on the surface of the main body part 50 at the attraction-side. The distance from the attraction electrodes 11 and 12 to the surface (top portion) of the contact support part 52 of the attraction part 51 can be set longer than the distance from the attraction electrodes 11 and 12 to the surface of the non-contact part 53 of the attraction part 51, so that the resistance value of the contact support part 52 can be therefore set to a large value, whereby the Johnsen-Rahbek force can be controlled to a desired value.

Consequently, according to this embodiment, it is possible to provide the attraction device 5 that is more versatile and in which the attraction force of the contact support part 52 and the non-contact part 53 of the attraction part 51 can be readily adjusted.

Figure 4:
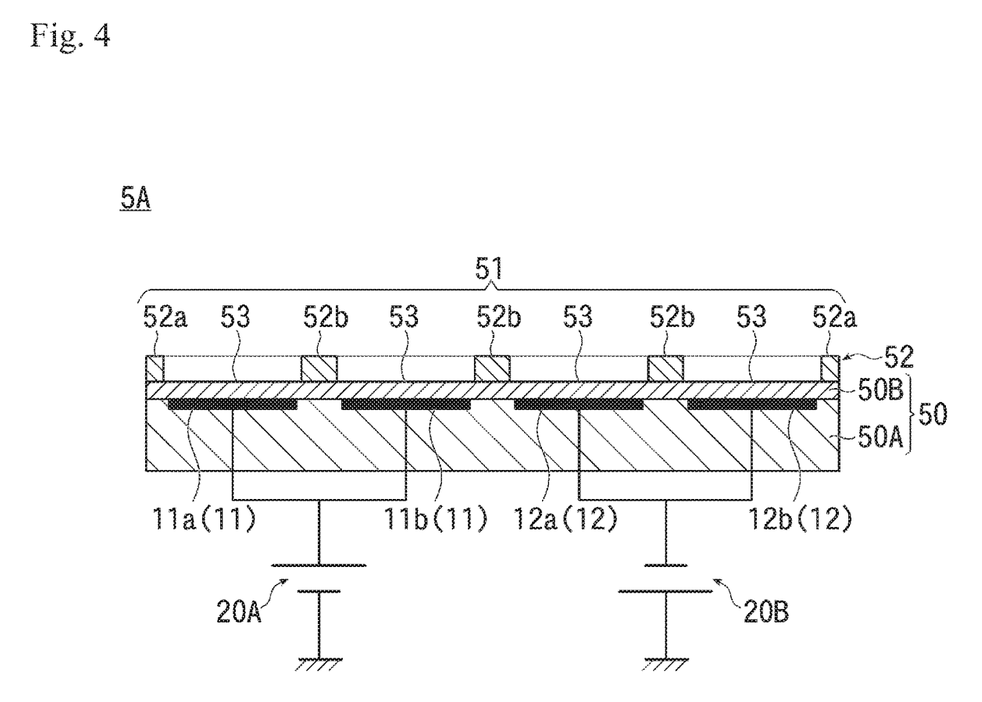
FIG. 4 is a cross-sectional view schematically illustrating another configuration example of the attraction device according to the present invention.

FIG. 4 is a cross-sectional view schematically illustrating another configuration example of the attraction device according to the present invention. Hereinbelow, a component corresponding to that of the above-described configuration example is denoted by an identical reference numeral, and a detailed description thereof will be omitted.

As illustrated in FIG. 4, in an attraction device 5A of this configuration example, the main body part 50 of the aforementioned attraction device 5 includes: a base 50A thereof; and a layer-shaped high resistance body 50B (hereinafter referred to as "high resistance body layer") provided on the surface of the base 50A at the attraction-side.

In this case, the base 50A of the main body part 50 is formed in, for example, a rectangular plate shape, and the aforementioned attraction electrodes 11 and 12 are provided on the surface layer portion of one of the main surfaces of the base 50A.

This base 50A can use various types of ceramics materials employed in common attraction devices.

On the other hand, on the main surface of the base 50A on the side of the attraction electrodes 11 and 12, the high resistance body layer 50B formed of the material of the aforementioned non-contact part 53 is integrally provided.

Specifically, as the material for the high resistance body layer 50B, may be used aluminum oxide ($Al_2O_3$), Pyrolytic boron nitride (PBN), silicon nitride (SiN), aluminum nitride (AlN), silicon monoxide (SiO), and sialon (SiAlON) and the like.

This high resistance body layer 50B is provided entirely on the main surface (surface) on the side of the attraction electrodes 11 and 12 of the base 50A and thereby covers the attraction electrodes 11 and 12.

Furthermore, as descried above, on the high resistance body layer 50B of the main body part 50, the contact support part 52 constituted by the frame part 52a and the straight part 52b is provided. Thereby, the plane portion of the high resistance body layer 50B, which is provided to be exposed between the frame part 52a and the straight part 52b of the contact support part 52, serves as the non-contact part 53.

As a material of the high resistance body layer 50B of this configuration example, it is preferable to use the aforementioned material whose volume resistivity has been lowered by doping an additive.

FIG. 5(a) to FIG. 5(d) are process diagrams illustrating an example of a method of manufacturing the attraction device illustrated in FIG. 4.

As shown in FIG. 5(a), a base forming body 50a and a high resistance layer forming body 50b are prepared. The base forming body 50a is formed of a constituent material of the base 50A of the main body part 50, and the attraction electrodes 11 and 12 are provided in the surface layer portion of one of the main surfaces of the base forming body 50a. The high resistance body forming layer 50b is formed of a constituent material of the high resistance body layer 50B of the main body part 50.

The base forming body 50a and the high resistance layer forming body 50b are formed in, for example, a rectangular plate shape using the respective constituent materials of the base 50A and the high resistance body layer 50B of the main body part 50 by a publicly known method, such as press forming.

Next, as shown in FIG. 5(b), the aforementioned high resistance layer forming body 50b is disposed on the aforementioned base forming body 50a, and the base forming layer 50a and the high resistance layer forming body 50b are disposed in a sintering furnace (not shown in the drawings) and heated at a predetermined temperature to perform sintering (sintering process).

Thereby, as shown in FIG. 5(c), it is possible to produce the main body part 50 of which the high resistance body layer 50B is integrally provided on the main surface on the side of the attraction electrodes 11 and 12 of the base 50A.

Thereafter, the contact support part 52 on the high resistance body layer 50B is produced by the aforementioned film forming process or vapor deposition polymerization method.

Figure 5:
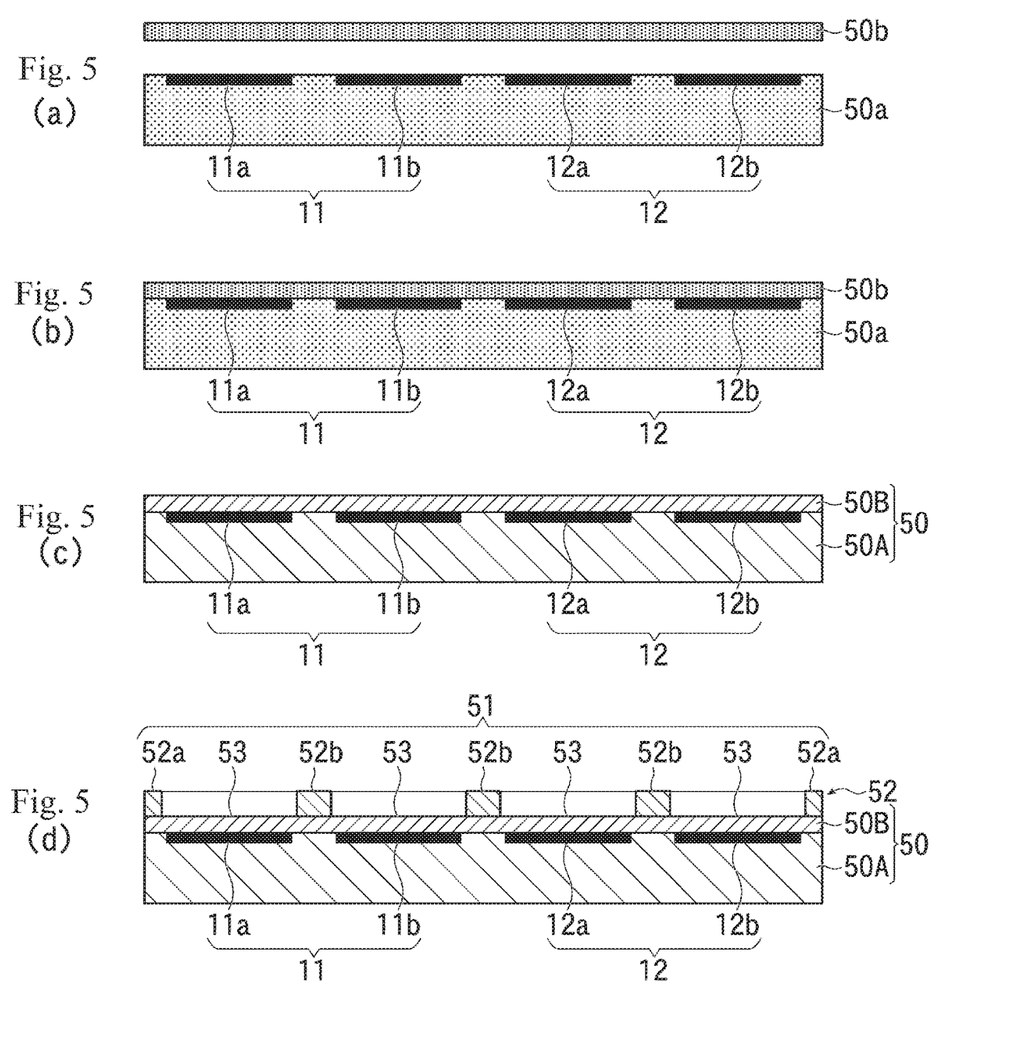
FIG. 5(a) to FIG. 5(d) are process diagrams illustrating an example of a method of manufacturing the attraction device illustrated in FIG. 4.

Thereby, as shown in FIG. 5 (d), the main body part 50 including the contact support part 52 and the non-contact part 53 of the attraction part 51 can be obtained.

In this configuration example, the main body part 50 includes: the base 50A which is formed in a plate shape, and the attraction electrodes 11 and 12 are provided on the surface layer portion of one of the main surfaces of the base 50A; and the high resistance body layer 50B formed of the material of the non-contact part 53 and is provided integrally on the main surface of the base 50A at the side of the attraction electrodes 11 and 12, and the contact support part 52 of the attraction part is provided on the surface of this layer-shaped high resistance body. Therefore, it is possible to adopt various methods of producing the base 50A. Because various ceramics materials, in addition to the aforementioned high-molecular weight polymers and chemicals, can be used as a material of the base 50A, the attraction device 5A that is more versatile can be provided.

Furthermore, as the high resistance body layer 50B is disposed on the main surface on the side of the attraction electrodes 11 and 12 of the base 50A and sintering is performed to produce the main body part 50 in this configuration example, the aforementioned attraction device 5A can be readily manufactured.

The present invention is not limited to the aforementioned embodiments and can be modified in various manners.

For example, the shapes of the attraction electrodes 11 and 12, the contact support part 52, and the non-contact part 53, all of which are described in the aforementioned embodiments, are merely examples and can be modified in various manners as long as such modifications do not go beyond the scope of the present invention.

In addition, the present invention is applicable not only to sputtering devices, but also to various vacuum processing devices, such as vapor deposition and etching devices.

REFERENCE SIGNS LIST 1 sputtering device (vacuum processing device)
2 vacuum chamber
3 target
4 sputtering power supply
5 attraction device
10 substrate (object to be attracted)
11, 11a, 11b, 12, 12a, 12b attraction electrode
20 attraction power supply 50 main body part
51 attraction part
52 contact support part
53 non-contact part

What is claimed is:

1. A method of attracting an object to be attracted by making combined use of Coulomb's force and Johnson-Rahbek force, the method using an attraction device including: a main body part having an attraction electrode inside a dielectric; and an attraction part provided on a surface of the main body part at an attraction-side and attracting the object to be attracted, the attraction part including a non-contact part not in contact with the object to be attracted, and a contact support part protruding from the surface of the non-contact part, the contact support part coming into contact with and supporting the object to be attracted, the attraction device being configured so that in the attraction part, a volume resistivity of a material of the contact support part is greater than a volume resistivity of a material of the non-contact part, the method including controlling an attraction force at the contact support part of the attraction part to be lower than or equal to an attraction force at the non-contact part of the attraction part by providing the contact support part of the attraction part in an area other than an area corresponding to the attraction electrode on the surface of the non-contact part and making a distance between the attraction electrode and a top of the contact support part of the attraction part greater than a distance between the attraction electrode and the surface of the non-contact part of the attraction part to thereby increase a resistance value between the attraction electrode and the contact support part.

2. The method of attracting an object to be attracted according to claim 1, wherein the main body part includes:

a base which is for in a plate shape, and the attraction electrode is provided on a surface layer portion of one of main surfaces of the base; and a layer-shaped high resistance body that is integrally provided on the main surface on the base at an attraction electrode side, and formed of the material of the non-contact part, and wherein the contact support part of the attraction part is provided on the surface of the layer-shaped high resistance body.

3. A method of vacuum processing to perform a predetermined process with a substrate attracted by making combined use of Coulomb's force and Johnson-Rahbek force in a vacuum chamber, the attracting method using an attraction device including: a main body having an attraction electrode inside a dielectric; and an attraction part provided on a surface of the main body at an attraction-side and attracting the object to be attracted, the attraction part including a non-contact part not in contact with the object to be attracted, and a contact support part protruding from the surface of the non-contact part, the contact support part coming into contact with and supporting the object to be attracted, the attraction device being configured so that in the attraction part, a volume resistivity of a material of the contact support part is greater than a volume resistivity of a material of the non-contact part, the attracting method including controlling an attraction force at the contact support part of the attraction part to be to than or equal to an attraction force at the non-contact part of the attraction part by providing the contact support part of the attraction part in an area other than an area corresponding to the attraction electrode on the surface of the non-contact part and making a distance between the attraction electrode and a top of the contact support part of the attraction part greater than a distance between the attraction electrode and the surface of the non-contact part of the attraction part to thereby increase a resistance value between the attraction electrode and the contact support part.

* * * * *